(12) United States Patent
Sumita et al.

(10) Patent No.: US 6,429,238 B1
(45) Date of Patent: Aug. 6, 2002

(54) FLIP-CHIP TYPE SEMICONDUCTOR DEVICE SEALING MATERIAL AND FLIP-CHIP TYPE SEMICONDUCTOR DEVICE

(75) Inventors: Kazuaki Sumita; Kimitaka Kumagae; Miyuki Wakao; Toshio Shiobara, all of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/590,081

(22) Filed: Jun. 9, 2000

(30) Foreign Application Priority Data

Jun. 10, 1999 (JP) ............................................. 11-163513

(51) Int. Cl.[7] .................... C08K 5/3445; C08K 5/3492; C08L 63/00; C08L 83/06; C08G 77/14
(52) U.S. Cl. ......................... 523/461; 524/860; 528/25; 528/28; 528/38
(58) Field of Search .................... 523/461, 459; 524/265, 267, 462, 860; 528/25, 27, 28, 38; 556/410, 444

(56) References Cited

U.S. PATENT DOCUMENTS

| | | | |
|---|---|---|---|
| 4,552,907 A | * 11/1985 | Sato et al. ................... 523/455 |
| 4,877,822 A | 10/1989 | Itoh et al. | |
| 4,902,732 A | 2/1990 | Itoh et al. | |
| 4,999,699 A | 3/1991 | Christie et al. | |
| 5,001,542 A | * 3/1991 | Tsukagoshi et al. .......... 357/68 |
| 5,053,445 A | 10/1991 | Itoh et al. | |
| 5,089,440 A | 2/1992 | Christie et al. | |
| 5,248,710 A | * 9/1993 | Shiobara et al. ............. 523/435 |
| 5,292,688 A | 3/1994 | Hsiao et al. | |
| 5,319,005 A | * 6/1994 | Hagiwara et al. ........... 523/435 |
| 5,385,869 A | * 1/1995 | Liu et al. ....................... 29/841 |
| 5,863,988 A | * 1/1999 | Hashimoto et al. ......... 525/105 |
| 5,928,595 A | 7/1999 | Knapp et al. | |
| 6,054,222 A | * 4/2000 | Takami ........................ 428/417 |
| 6,103,549 A | * 8/2000 | Master et al. ................ 438/106 |
| 6,238,840 B1 | * 5/2001 | Hirayama et al. ....... 430/280.1 |

FOREIGN PATENT DOCUMENTS

| | | | |
|---|---|---|---|
| EP | 428870 | * 5/1991 |
| JP | B2-6360069 | 11/1988 |
| JP | A6148554 | 5/1994 |
| JP | 07188517 | * 7/1995 |
| JP | 08012857 | * 1/1996 |
| JP | A10195179 | 7/1998 |
| JP | A10338735 | 12/1998 |

OTHER PUBLICATIONS

English Translation of JP 08012857 (1996).*
English Translation of JP 07188517 (1995).*

* cited by examiner

Primary Examiner—Vasu Jagannathan
Assistant Examiner—Callie E. Shosho
(74) Attorney, Agent, or Firm—Birch, Stewart, Kolasch & Birch, LLP

(57) ABSTRACT

Blended in a liquid epoxy resin composition comprising a liquid epoxy resin and an inorganic filler are a specific imidazole compound as a curing accelerator and an amino group-containing, polyether-modified polysiloxane. The resulting composition is suited as a sealing material for flip-chip type semiconductor devices since it has improved thin-film infiltration and storage stability.

6 Claims, 1 Drawing Sheet

FLIP-CHIP TYPE SEMICONDUCTOR DEVICE SEALING MATERIAL AND FLIP-CHIP TYPE SEMICONDUCTOR DEVICE

This invention relates to a flip-chip type semiconductor device sealing material and a flip-chip type semiconductor device encapsulated therewith.

BACKGROUND OF THE INVENTION

With the advance of electric equipment toward smaller size, lighter weight and higher performance, the semiconductor mounting technology has changed from the pin mating type to the surface mounting which now becomes the mainstream. One bare chip mounting technology is flip-chip (FC) mounting. The flip-chip mounting is a technique of providing an LSI chip on its circuit pattern-bearing surface with several to several thousands of electrodes, known as bumps, of about 10 to 100 microns high and joining the chip to electrodes on a substrate with a conductive paste or solder. Then the sealing material used for the protection of FC devices must penetrate into gaps of several tens of microns defined by bumps between the substrate and the LSI chip. Conventional liquid epoxy resin compositions used as the underfill material for flip-chip devices are generally composed of a liquid epoxy resin, a curing agent and an inorganic filler. Of these, the most predominant is a composition in which a large amount of inorganic filler is blended in order to provide a matching coefficient of linear expansion with those of semiconductor chips, substrates and bumps for increased reliability.

With respect to stress properties, the flip-chip underfill materials with high loading of filler give rise to no problem. However, they suffer from very low productivity since they have a high viscosity due to the high filler loading so that they may penetrate into the gap between chip and substrate at a very slow rate. There is a desire to overcome this problem.

In conventional liquid epoxy resin compositions used as underfill material, acid anhydrides are often employed as the curing agent. Since the acid anhydrides are hygroscopic, there arises prior to curing a phenomenon that a viscosity increase due to moisture absorption can cause varying infiltration or interrupt infiltration. Also, the acid anhydrides are likely to pick up moisture prior to curing and even after curing, subject to enhanced hydrolysis by virtue of ester bonds, both of which in turn can cause volumetric expansion, increasing the resistance at the interface between solder bumps and leads. This gives rise to a reliability problem.

From the standpoint of reducing the manufacture cost of flip-chip type semiconductor devices, it now becomes the mainstream in the art to seal flip-chip type semiconductor devices with underfill material without cleaning the devices of the flux used in connecting solder bumps. The omission of cleaning means that the flux is left on the substrate and the circuit portion of the silicon chip, giving rise to several problems. The contact of the residual flux with the underfill material can cause voids to form within the underfill material and preclude effective curing of the underfill material. Also separation can often occur at the interface between the flux and the underfill material.

SUMMARY OF THE INVENTION

An object of the invention is to provide a sealing material suitable for an underfill material for a flux-uncleaned flip-chip type semiconductor device which maintains a low enough viscosity to ensure interstitial infiltration even when filled with a large amount of inorganic filler. Another object is to provide a flip-chip type semiconductor device encapsulated with the sealing material and having improved reliability.

It has been found that a liquid epoxy resin composition comprising a liquid epoxy resin and an inorganic filler is improved using a curing accelerator of the general formula (1) to be defined below having a solubility of up to 1% by weight in the epoxy resin, a melting point of at least 170° C., a mean particle diameter of up to 5 μm, and a maximum particle diameter of up to 20 μm, and an amino group-containing, polyether-modified polysiloxane of the general formula (3) to be defined below. The resulting composition remains highly stable at elevated temperatures and when used for the encapsulation of flip-chip semiconductor devices, can infiltrate through narrow gaps at a low viscosity even with high loading of the inorganic filler, as long as the semiconductor device is heated to elevated temperatures. The composition thus provides a sealing material suitable as an underfill material for flip-chip semiconductor devices, especially when the flux has not been removed.

As described above, acid anhydrides are widely employed as the curing agent in conventional liquid epoxy resin compositions used as underfill material. Since the acid anhydrides are hygroscopic, there arises prior to curing a phenomenon that a viscosity increase due to moisture absorption can diversify the infiltration capability or interrupt infiltration. Also, the acid anhydrides are likely to pick up moisture prior to curing and even after curing, subject to enhanced hydrolysis by virtue of ester bonds, both of which in turn can cause volumetric expansion, increasing the resistance at the interface between solder bumps and leads. This gives rise to a reliability problem. It is thus believed that how to reduce the saturation moisture pickup is a key to reliability improvement. A study is made on a resin composition having epoxy self-condensation or ether bonds which are less liable to hydrolysis than ester bonds. Use of this curing system can minimize the deterioration of properties by humidity, for example, lowering of bonding force and glass transition temperature (Tg) after water absorption. However, the epoxy self-condensation system has a drawback that it tends to be highly viscous because of the resin's viscosity and thus has an inferior infiltration capability, as compared with the acid anhydride curing system. This drawback can be overcome by using the curing accelerator which is stable at elevated temperatures and keeping the device at elevated temperatures so that the sealing material may become low viscous and have a high infiltration capability. In addition, as opposed to the acid anhydride system which is unstable during storage and must be kept at very low temperatures for storage, the composition of the invention using a potential catalyst is improved in storage stability and its viscosity remains unchanged over 96 hours at room temperature (25° C.).

Accordingly, a sealing material in the form of a liquid epoxy resin composition as defined herein for use with flip-chip type semiconductor devices, especially for flux-uncleaned flip-chip type semiconductor devices has improved thin-film infiltration capability and storage stability as an underfill material. A semiconductor device encapsulated with the sealing material remains highly reliable.

Thus the invention provides a sealing material for flip-chip type semiconductor devices in the form of a liquid epoxy resin composition comprising (A) a liquid epoxy resin, (B) an inorganic filler, (C) a curing accelerator having a solubility of up to 1% by weight in the epoxy resin, a melting point of at least 170° C., a mean particle diameter of up to 5 μm, and a maximum particle diameter of up to 20 μm, and (D) an amino group-containing, polyether-modified polysiloxane. The curing accelerator (C) is represented by the following general formula (1):

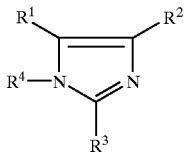

(1)

wherein $R^1$ and $R^2$ each are hydrogen (—H), methyl (—CH$_3$), ethyl (—C$_2$H$_5$), hydroxymethyl (—CH$_2$OH) or phenyl (—C$_6$H$_5$), $R^3$ is methyl (—CH$_3$), ethyl (—C$_2$H$_5$), phenyl (—C$_6$H$_5$) or allyl (—CH$_2$CH=CH$_2$), and $R^4$ is hydrogen (—H) or a group of the following formula (2).

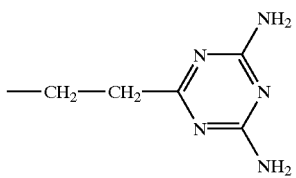

(2)

The amino group-containing, polyether-modified polysiloxane (D) is represented by the following general formula (3):

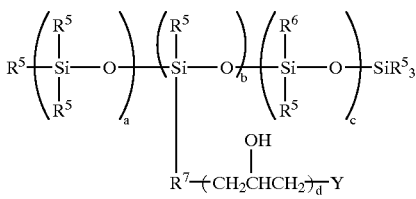

(3)

wherein $R^5$ is a monovalent hydrocarbon group of 1 to 6 carbon atoms, $R^6$ is a monovalent hydrocarbon group of 1 to 6 carbon atoms or monovalent organic nitrogenous group having at least one NH group, $R^7$ is a divalent hydrocarbon group of 1 to 10 carbon atoms or divalent organic nitrogenous group having at least one NH group, the compound of formula (3) containing at least one NH group in a molecule, a is an integer of 10 to 200, b is an integer of 1 to 10, c is an integer of 0 to 10, and d is equal to 0 or 1, and Y is a group of the following general formula (4):

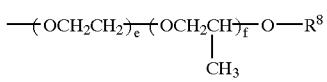

(4)

wherein $R^8$ is a monovalent hydrocarbon group of 1 to 6 carbon atoms, e is an integer of 0 to 25, f is an integer of 5 to 50, and e and f satisfy e/f≦1 and e+f=10 to 50.

Also contemplated herein is a flip-chip type semiconductor device sealed with the sealing material.

DESCRIPTION OF THE PREFERRED EMBODIMENTS

Figure 1:
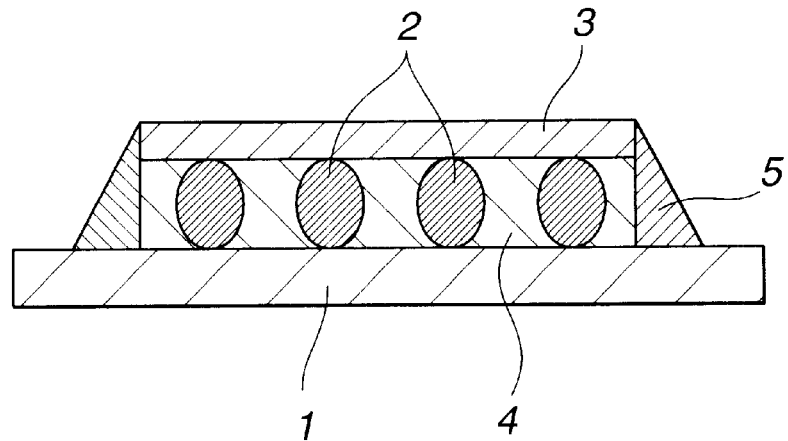
FIG. 1 is a schematic cross-sectional view of a flip-chip type semiconductor device according to one embodiment of the invention.

In the epoxy resin composition providing a flip-chip type semiconductor device sealing material according to the invention, the liquid epoxy resin used as component (A) may be any epoxy resin as long as it has at least two epoxy groups in a molecule. Preferred examples include bisphenol type epoxy resins such as bisphenol A type epoxy resins and bisphenol F type epoxy resins, novolac type epoxy resins such as phenol novolac type epoxy resins and cresol novolac type epoxy resins, naphthalene type epoxy resins, biphenyl type epoxy resins, and cyclopentadiene type epoxy resins. Of these, epoxy resins which are liquid at room temperature (25° C.) are used. Any of epoxy resins of the following structure may be added to the foregoing epoxy resins in such an amount as not to adversely affect the interstitial infiltration thereof.

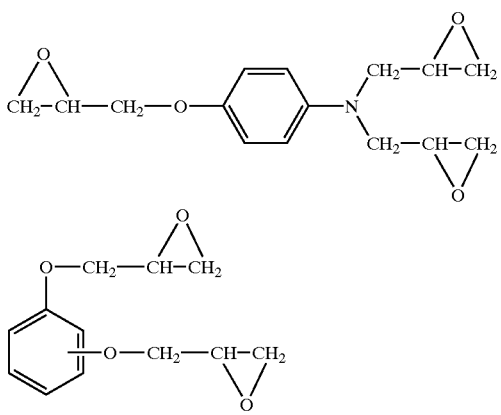

The liquid epoxy resins preferably have a total chlorine content of up to 1,500 ppm, and especially up to 1,000 ppm. When chlorine is extracted from the epoxy resin with water at an epoxy resin concentration of 50% and a temperature of 100° C. over a period of 20 hours, the water-extracted chlorine content is preferably up to 10 ppm. At a total chlorine content of greater than 1,500 ppm or a water-extracted chlorine level of more than 10 ppm, the semiconductor device would become less reliable, especially in the presence of moisture.

To the epoxy resin composition, a variety of well-known inorganic fillers are added as component (B) for the purpose of reducing a coefficient of expansion. Useful inorganic fillers include fused silica, crystalline silica, alumina, boron nitride, aluminum nitride, silicon nitride, magnesia, and magnesium silicate. Inter alia, spherical, especially true spherical, fused silica is desirable for low viscosity and effective infiltration. In order that the sealing material used as the underfill achieve both an improvement in infiltration and a reduction of linear expansion, a particulate filler having a mean particle diameter of less than about ⅒ and a maximum particle diameter of less than about ½ of the flip-chip gap width (that is the distance of the substrate-to-chip gap) is preferred. Usually the filler has a maximum particle diameter of up to 50 μm, desirably up to 45 μm, and more desirably up to 25 μm and a mean particle diameter of up to 10 μm (typically, 0.5 to 10 μm), desirably 0.5~5 μm, and more desirably 1 to 5 μm, most desirably 1 to 3 μm.

The inorganic filler is preferably blended in an amount of about 100 to 400 parts, more preferably about 150 to 250 parts by weight per 100 parts by weight of the epoxy resin, curing agent, and optional epoxy or phenolic resin-organopolysiloxane copolymer combined. On this basis, less than 100 parts of the inorganic filler would provide an epoxy resin composition with a greater coefficient of expansion so that cracks may be incurred in a thermal cycling test. An epoxy resin composition with more than 400 parts of the inorganic filler would be too viscous, restraining its infiltration in thin film form.

According to the invention, an imidazole compound of the following general formula (1) having a solubility of up to 1% by weight in the epoxy resin, a melting point of at least 170° C., a mean particle diameter of up to 5 μm, typically 1 to 5 μm, and a maximum particle diameter of up to 20 μm is used as a reaction or curing accelerator for the above-described epoxy resin.

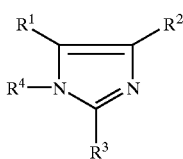
(1)

Herein $R^1$ and $R^2$ each are hydrogen (—H), methyl (—CH$_3$), ethyl (—C$_2$H$_5$), hydroxymethyl (—CH$_2$OH) or phenyl (—C$_6$H$_5$). $R^3$ is methyl (—CH$_3$), ethyl (—C$_2$H$_5$), phenyl (—C$_6$H$_5$) or allyl (—CH$_2$CH=CH$_2$). $R^4$ is hydrogen (—H) or a group of the following formula (2).

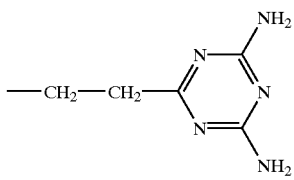
(2)

Illustratively, the most preferred curing accelerators are imidazole derivatives having a melting point of at least 170° C., such as 2,4-diamino-6-[2'-methylimidazolyl-(1)']-ethyl-S-triazine, 2,4-diamino-6-[2'-ethyl-4'-methylimidazolyl-(1)']-ethyl-S-triazine, 2,4-diamin-6-[2'-methylimidazolyl-(1)']-ethyl-S-triazine isocyanuric acid adduct, 2-phenyl-4-methyl-5-hydroxymethylimidazole, 2-phenyl-4,5-dihydroxymethylimidazole, 2-aryl-4,5-diphenylimidazole, and 2,4,5-triphenylimidazole. These imidazole derivatives are solid at room temperature (25° C.). Useful are those imidazole derivatives having a mean particle diameter of up to 5 μm, typically 1 to 5 μm and a maximum particle diameter of up to 20 μm, and especially a mean particle diameter of 2 to 5 μm and a maximum particle diameter of up to 15 μm. A curing accelerator having too small a mean particle diameter has an increased specific surface area so that when mixed with the epoxy resin, the composition may have a higher viscosity. A curing accelerator having a mean particle diameter in excess of 5 μm is non-uniformly dispersed in the epoxy resin, leading to a loss of reliability. Preferably the curing accelerator has a greater particle size and specific surface area than the inorganic filler because the curing accelerator would otherwise be non-uniformly dispersed during mixing, leading to ineffective curing and adversely affecting reliability. When a silica filler has a mean particle diameter of 1 to 3 μm and a specific surface area of 2.5 m$^2$/g, for example, the curing accelerator should preferably have a mean particle diameter of 3 to 5 μm and a specific surface area of 2.5 to 10 m$^2$/g. The curing accelerator preferably has a purity of at least 90%, and more preferably at least 93%. The curing accelerator with a purity of less than 90% may give varying reactivity, resulting in varying curing and infiltration properties.

Understandably, the mean particle diameter as used herein can be determined, for example, as the weight average (or median diameter) in the particle size distribution as measured by the laser light diffraction method.

Preferably the curing accelerator is blended in an amount of about 1 to 15 parts, and especially about 2 to 7 parts by weigh per 100 parts by weight of the epoxy resin. Less than 1 part of the curing accelerator may lead to short curing whereas more than 15 parts of the curing accelerator is effective for curing, but may detract from storage stability.

According to the invention, (D) an amino group-containing, polyether-modified polysiloxane of the following general formula (3) is added to the sealing material, thereby improving the compatibility thereof with the flux (used in soldering) and precluding void formation.

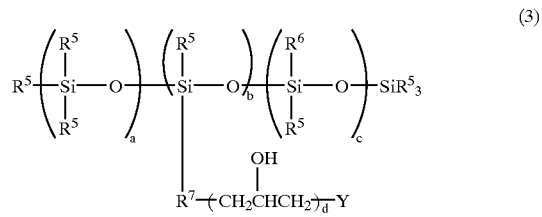
(3)

Herein $R^5$ is a monovalent hydrocarbon group of 1 to 6 carbon atoms. $R^6$ is a monovalent hydrocarbon group of 1 to 6 carbon atoms or monovalent organic nitrogenous group having at least one NH group. $R^7$ is a divalent hydrocarbon group of 1 to 6 carbon atoms or divalent organic nitrogenous group having at least one NH group. The compound of formula (3) should contain at least one NH group in a molecule. Y is a group of the following general formula (4):

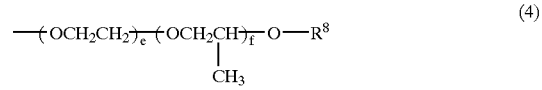
(4)

wherein $R^8$ is a monovalent hydrocarbon group of 1 to 6 carbon atoms, e is an integer of 0 to 25, f is an integer of 5 to 50, and e and f satisfy $e/f \leq 1$ and e+f=10 to 50. Letter a is an integer of 10 to 200, preferably 20 to 100, b is an integer of 1 to 10, c is an integer of 0 to 10, and d is equal to 0 or 1.

More illustratively, $R^5$ stands for monovalent hydrocarbon groups of 1 to 6 carbon atoms, for example, alkyl groups such as methyl, ethyl, propyl, isopropyl, butyl, isobutyl, tert-butyl, pentyl and hexyl; alkenyl groups such as vinyl, allyl, propenyl, isopropenyl and butenyl; aryl groups such as phenyl; and cycloalkyl groups such as cyclohexyl.

$R^6$ stands for monovalent hydrocarbon groups of 1 to 6 carbon atoms or monovalent organic nitrogenous groups having at least one NH group. Examples of the monovalent hydrocarbon groups represented by $R^6$ are the same as exemplified for $R^5$. Examples of the monovalent organic nitrogenous groups having at least one NH group represented by $R^6$ include
a group represented by —R'—NR"—R'—NR"$_2$ and
a group represented by —R'—NR"$_2$.
Herein, R' is an alkylene group of 1 to 20 carbon atoms, preferably 1 to 10 carbon atoms, arylene group or alkylene-arylene group. Exemplary alkylene groups are methylene, ethylene, trimethylene, tetramethylene, pentamethylene, hexamethylene, and methylethylene. Exemplary arylene groups are phenylene, tolylene, and xylylene. Exemplary alkylene-arylene groups are those of the following structures.

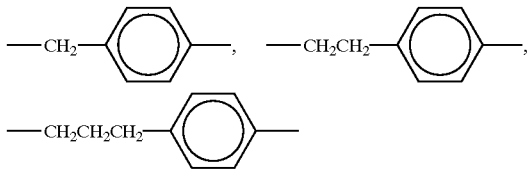

R" is hydrogen or an alkyl group of 1 to 20 carbon atoms, preferably 1 to 6 carbon atoms, or an aryl group. Exemplary are hydrogen, methyl, ethyl, propyl, isopropyl, butyl, isobutyl, tert-butyl, pentyl, hexyl, cyclohexyl, phenyl, tolyl and xylyl.

$R^7$ stands for divalent hydrocarbon groups of 1 to 10 carbon atoms, preferably 1 to 6 carbon atoms or divalent organic nitrogenous groups having at least one NH group. Examples of the divalent hydrocarbon group of 1 to 10 carbon atoms are alkylene, arylene, alkylene-arylene groups as exemplified for R', and cycloalkylene groups such as cyclohexylene. Examples of the divalent organic nitrogenous group having at least one NH group include a group represented by —R'—NR"—R'—NR"— and
a group represented by —R'—NR"— wherein R' and R" are as defined above in conjunction with $R^6$.

The compound of formula (3) should contain at least one NH group in a molecule.

Y is a polyether group of the general formula (4).

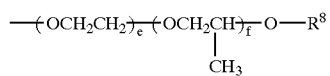

(4)

Herein $R^8$ is a monovalent hydrocarbon group of 1 to 6 carbon atoms, as exemplified for $R^5$. Letters e is an integer of 0 to 25, letter f is an integer of 5 to 50, and e and f satisfy e/f≦1 and e+f=10 to 50. If e/f exceeds 1, a lowering of humidity resistance may occur because the ethylene oxide component is hydrophilic. Preferably e/f≦0.8. If e+f exceeds 50, there may occur losses of humidity resistance, flow and infiltration. Note that e may be 0.

The proportion of the polyether group Y is preferably in the range of 20 to 70% by weight of the modified polysiloxane (D). A polysiloxane with less than 20% of Y may be less compatible with the base resin. In excess of 70%, a lowering of humidity resistance may occur because the polyether group is hydrophilic.

Letter a is an integer of 10 to 200, preferably 20 to 100, b is an integer of 1 to 10, c is an integer of 0 to 10, and d is equal to 0 or 1.

As the amino group-containing, polyether-modified polysiloxane of formula (3), a polysiloxane of the following general formula (5) is preferred.

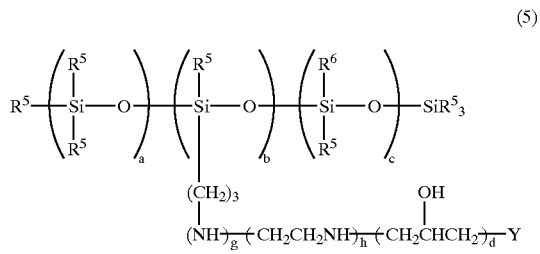

(5)

Herein g is equal to 0 or 1, h is 0 or an integer of 1 to 10, preferably 0, 1 or 2, and $R^5$, $R^6$, Y, a, b, c and d are as defined above.

Illustrative examples of the amino group-containing, polyether-modified polysiloxane are those compounds of the following structures.

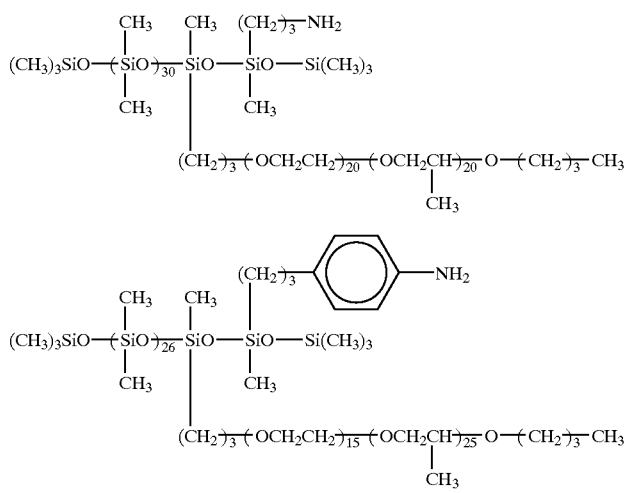

-continued

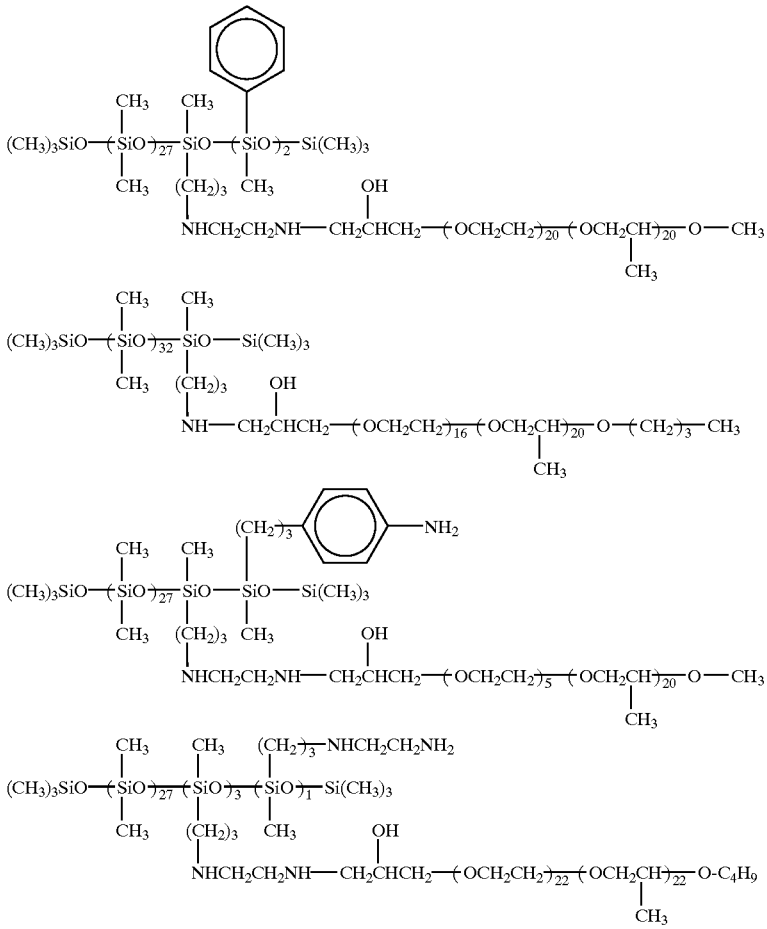

An appropriate amount of the amino group-containing, polyether-modified polysiloxane blended is 0.1 to 10 parts, desirably 0.5 to 6 parts by weight per 100 parts by weight of the epoxy resin. Less than 0.1 part of the modified polysiloxane is ineffective for improving the compatibility of the sealing material with the flux, leaving the risk of void formation. More than 10 parts of the modified polysiloxane can adversely affect cure.

In the epoxy resin composition as the sealing material of the invention, silicone rubber, silicone oil, liquid polybutadiene rubber or a thermoplastic resin such as methyl methacrylate-butadiene-styrene copolymer may be blended for the purpose of stress reduction. The preferred stress reducing agent is a copolymer obtained through addition reaction between an epoxy or phenolic resin having alkenyl groups and an organohydrogenpolysiloxane represented by the following average compositional formula (6) and having 10 to 400 silicon atoms, preferably 20 to 400 silicon atoms, more preferably 40 to 200 silicon atoms, and 1 to 5 SiH groups (i.e., hydrogen atoms attached to silicon atoms), preferably 2 to 4 SiH groups, more preferably 2 SiH groups per molecule. The addition reaction takes place between alkenyl groups on the epoxy or phenolic resin and SiH groups on the organopolysiloxane.

Herein R is a substituted or unsubstituted monovalent hydrocarbon group, a is a positive number of 0.005 to 0.2, b is a positive number of 1.8 to 2.2, and $1.805 \leq a+b \leq 2.3$, preferably a is 0.01 to 0.1, b is 1.9 to 2.0, and $1.91 \leq a+b \leq 2.1$.

The monovalent hydrocarbon groups (attached to silicon atoms) represented by R are preferably those of 1 to 10 carbon atoms, especially 1 to 8 carbon atoms, and preferably free of aliphatic unsaturation, for example, alkyl groups such as methyl, ethyl, propyl, isopropyl, butyl, isobutyl, tert-butyl, hexyl, cyclohexyl, octyl, and decyl; alkenyl groups such as vinyl, allyl, propenyl, butenyl, and hexenyl; aryl groups such as phenyl, xylyl and tolyl; and aralkyl groups such as benzyl, phenylethyl and phenylpropyl. Also included are halogen-substituted monovalent hydrocarbon groups wherein some or all of the hydrogen atoms in the foregoing hydrocarbon groups are replaced by halogen atoms such as chlorine, fluorine and bromine, for example, chloromethyl, bromoethyl and trifluoropropyl.

Preferred examples of the alkenyl group-containing phenolic or epoxy resin used in the copolymer are shown by the following formulae.

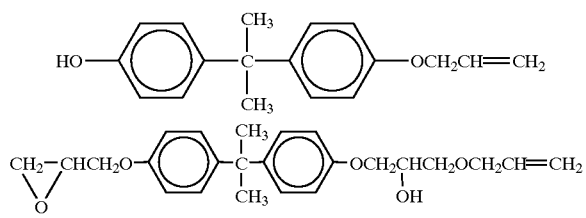

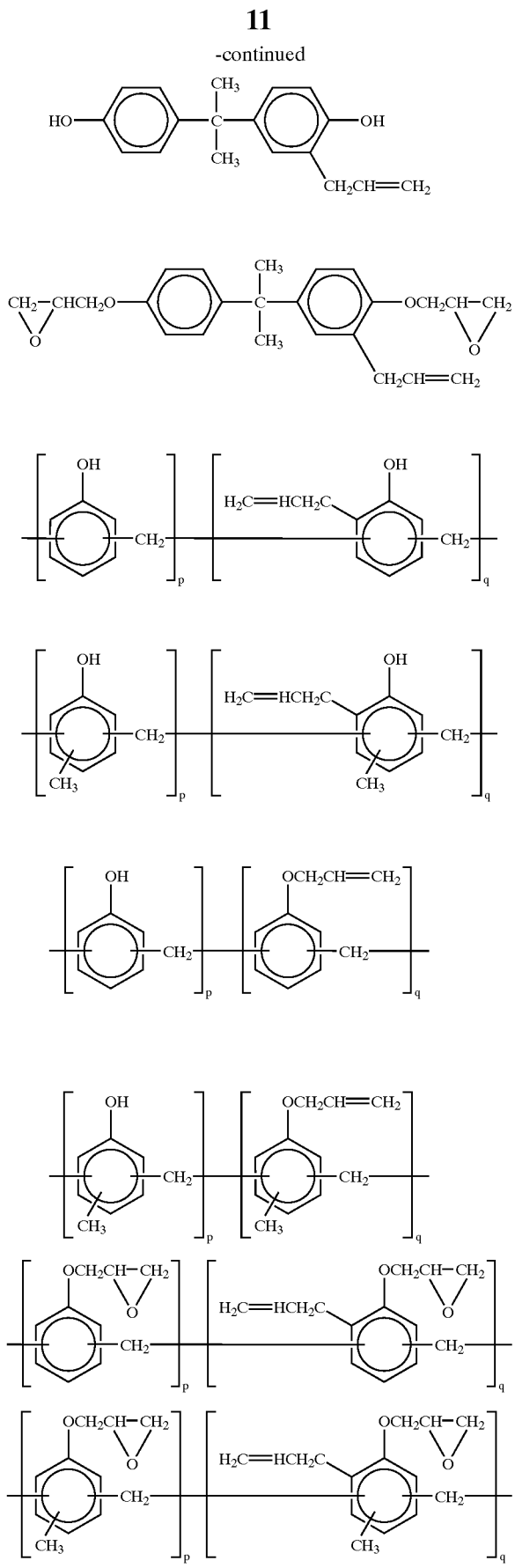

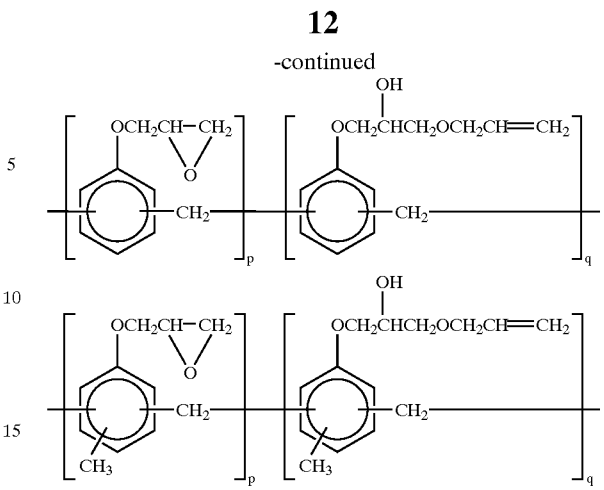

Herein, p and q are numbers satisfying $1 \leq p \leq 20$ and $1 \leq q \leq 5$, more preferably $1 \leq p \leq 10$ and $1 \leq q \leq 3$.

Examples of the organohydrogenpolysiloxane used in the copolymer include both end trimethylsiloxy-blocked methylhydrogenpolysiloxane, both end trimethylsiloxy-blocked dimethylsiloxane-methylhydrogensiloxane copolymers, both end dimethylhydrogensiloxy-blocked dimethylpolysiloxane, both end dimethylhydrogensiloxy-blocked dimethylsiloxane-methylhydrogensiloxane copolymers, both end dimethylhydrogensiloxy-blocked dimethylsiloxane-diphenylsiloxane copolymers, both end dimethylhydrogensiloxy-blocked dimethylsiloxane-methylphenylsiloxane copolymers. Although these exemplary siloxanes are of basically straight-chain structure, they may partially contain a branched siloxane structure.

The organopolysiloxane desirably has a molecular weight of about 700 to 50,000 though not critical. When a copolymer obtained from an organopolysiloxane having a molecular weight of about 700 to 50,000 is blended in the epoxy resin composition, the copolymer is incompatible with the matrix and forms a fine island-in-sea structure. With a molecular weight of less than 700, the copolymer is compatible with the matrix so that the island-in-sea structure may disappear. With a molecular weight of more than 50,000, the island-in-sea structure becomes larger. In either case, the advantage of stress reduction can be degraded.

In preparing a copolymer by reacting the alkenyl group-containing epoxy or phenolic resin with the organohydrogenpolysiloxane, well-known addition reaction can be employed to effect hydrosilylation reaction between alkenyl groups in the epoxy resin and hydrogen atoms attached to silicon atoms (i.e., SiH groups) in the organohydrogenpolysiloxane.

As the block copolymer mentioned above, use may be made of the known copolymers disclosed in JP-B 61-48544 corresponding to U.S. Pat. No. 4,902,732 and JP-B 63-60069 corresponding to U.S. Pat. No. 4,877,822 and U.S. Pat. No. 5,053,445. Typical examples are given below.

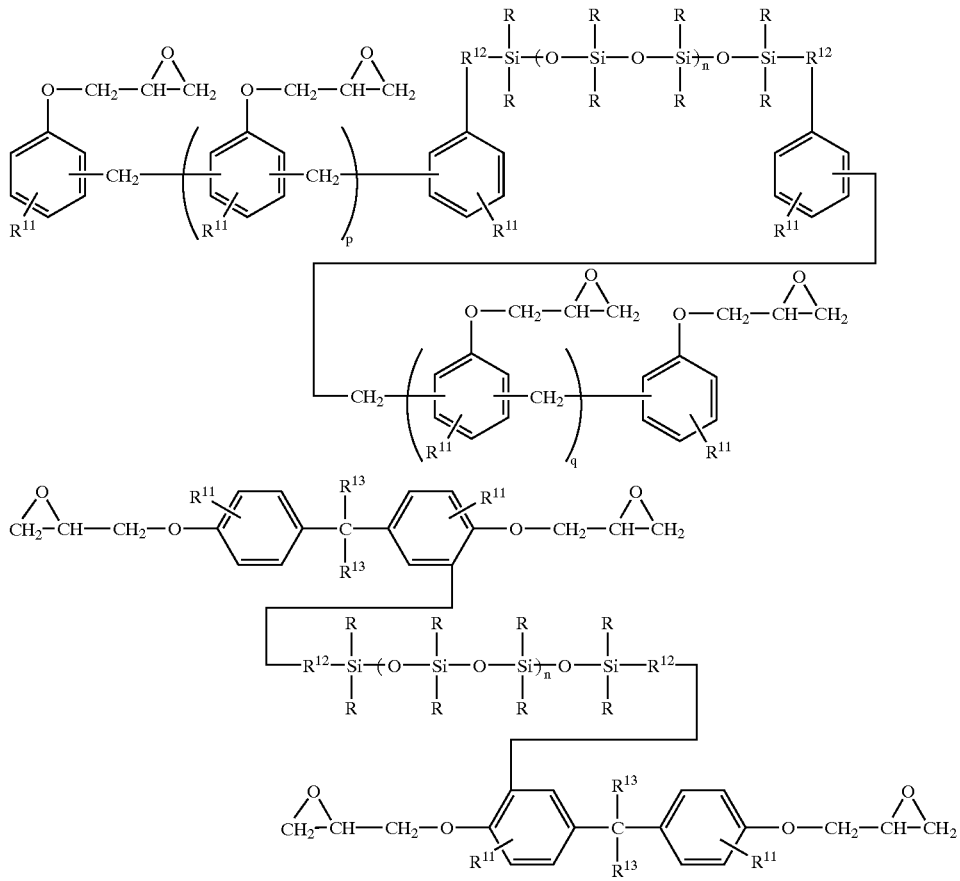

Herein, R is as defined above, $R^{11}$ is hydrogen or alkyl of 1 to 4 carbon atoms, $R^{12}$ is —$CH_2CH_2CH_2$—, —$OCH_2$—CH(OH)—$CH_2$—O—$CH_2CH_2CH_2$— or —O—$CH_2CH_2CH_2$—, $R^{13}$ is hydrogen, methyl or trifluoromethyl, letter n is an integer of 4 to 199, preferably 19 to 99, p is an integer of 1 to 10, and q is an integer of 1 to 10.

The copolymer is blended in such amounts that 0 to 20 parts, and preferably 2 to 15 parts by weight of the diorganopolysiloxane units may be available per 100 parts by weight of the liquid epoxy resin (A) whereby the stress can be further reduced.

The above-described epoxy resin can be cured with the curing accelerator (C) alone when it is a self-polymerizable epoxy resin. A curing agent is used as the case may be and insofar as the objects of the invention are not impaired. Typical curing agents include acid anhydrides of about 4 to 25 carbon atoms, preferably about 8 to 20 carbon atoms, preferably containing one or two aliphatic or aromatic rings and one or two acid anhydride groups in a molecule, such as tetrahydrophthalic anhydride, methyltetrahydrophthalic anhydride, methylhexahydrophthalic anhydride, hexahydrophthalic anhydride, methylhymic anhydride, pyromellitic acid dianhydride, benzophenonetetracarboxylic acid dianhydride, 3,3',4,4'-biphenyltetracarboxylic acid dianhydride, bis(3,4-dicarboxyphenyl)ether dianhydride, bis(3,4-dicarboxyphenyl)methane dianhydride, and 2,2-bis(3,4-dicarboxyphenyl)propane dianhydride; and carboxylic acid hydrazides such as dicyandiamide, adipic acid hydrazide and isophthalic acid hydrazide.

Where an acid anhydride is used as the curing agent, it is preferably blended so as to give 0.3 to 0.7 mol of acid anhydride groups

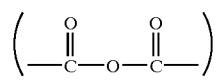

per mol of epoxy groups in the epoxy resin. Less than 0.3 mol of acid anhydride groups would provide insufficient curability whereas an amount giving more than 0.7 mol of acid anhydride groups would leave part of the acid anhydride unreacted, which leads to a drop of glass transition temperature. The more desirable range is 0.4 to 0.6 mol.

If necessary, another curing accelerator may be used insofar as the objects of the invention are not impaired.

In the sealing material in the form of a liquid epoxy resin composition according to the invention, various other additives are blended if necessary. Such additives include carbon-functional silanes for improving tackiness, pigments (e.g., carbon black), dyestuffs, antioxidants, and surface treating agents (e.g., γ-glycidoxypropyltrimethoxysilane).

The epoxy resin composition according to the invention can be prepared, for example, by simultaneously or separately agitating, dissolving, mixing and dispersing the epoxy resin, curing accelerator and other components while heating if desired. The device for mixing, agitating and dispersing the ingredients is not critical although an attritor, three-roll mill, ball mill or planetary mixer each equipped with agitating and heating means is generally used. A suitable combination of these devices is also useful.

With respect to the viscosity of the liquid epoxy resin composition used as the sealing material, it should preferably have a viscosity of less than about 10,000 poises at 25° C. A conventional method and conditions may be employed in molding or forming the sealing material. Preferably, a seal is formed by molding and curing the sealing material in a heating oven at 100 to 120° C. for at least ½ hour and then at 150° C. for at least ½ hour. Less than ½ hour of post-curing at 150° C. would fail to achieve satisfactory cured characteristics. Less than ½ hour of primary curing at 100 to 120° C. would allow voids to develop after curing.

Referring to FIG. 1, a flip-chip type semiconductor device according to one embodiment of the invention is illustrated as comprising an organic substrate 1 having a wiring pattern-bearing surface (upper surface in the figure). A semiconductor chip 3 is mounted on the wiring pattern-bearing surface via a plurality of bumps 2 to define gaps between the substrate 1 and the semiconductor chip 3 and also between the bumps 2. The gaps are filled with an underfill material 4 and sealed along sides thereof with a fillet material 5. The sealing material of the invention is advantageous especially in forming the underfill material in such a flip-chip type semiconductor device in which the flux has not been removed by cleaning.

When the sealing material of the invention is used as an underfill material, its cured product should preferably have a coefficient of thermal expansion (CTE) of 20 to 40 ppm/° C. at temperatures below its glass transition temperature (Tg). Any of well-known sealing materials may be used as the fillet material although a liquid epoxy resin composition similar to the above-mentioned one may also be used. When a liquid epoxy resin composition is used the fillet material, its cured product should preferably have a CTE of 10 to 20 ppm/° C. at temperatures below its Tg.

EXAMPLE

Examples of the invention are given below by way of illustration and not by way of limitation.

Examples 1–5 and Comparative Examples 1–5

Ten epoxy resin compositions were prepared by uniformly milling the components shown in Tables 1 and 2 in a three-roll mill. The following tests were carried out on these epoxy resin compositions. The results are also shown in Tables 1 and 2.

Viscosity

Using a BH type rotating viscometer, a viscosity at 25° C. was measured at 20 rpm.

Thixotropy

Using a BH type rotating viscometer, a viscosity at 25° C. was measured at 2 rpm and 20 rpm. Thixotropy is the viscosity at 2 rpm divided by the viscosity at 20 rpm.

Gelling Time

The time passed until the composition gelled on a hot plate at 150° C. was measured.

Glass Transition Temperature (Tg)

Using a thermomechanical analyzer (TMA), glass transition was observed while heating a cured sample of 5 mm ×5 mm×15 mm at a rate of 5° C./min.

CTE-1: a coefficient of thermal expansion at temperatures below Tg.

CTE-2: a coefficient of thermal expansion at temperatures above Tg.

In the above measurement of Tg, CTE-1 was determined in the temperature range of 50 to 80° C. and CTE-2 was determined in the temperature range of 200 to 230° C.

Infiltration Test

Figure 2A:
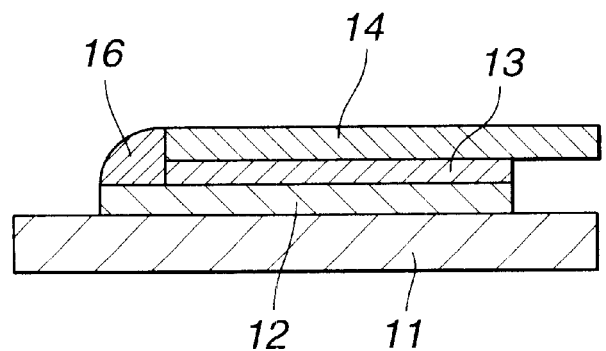
FIG. 2 illustrates a test piece used in an infiltration test, FIG. 2A being a side view and FIG. 2B being a plan view.
Figure 2B:
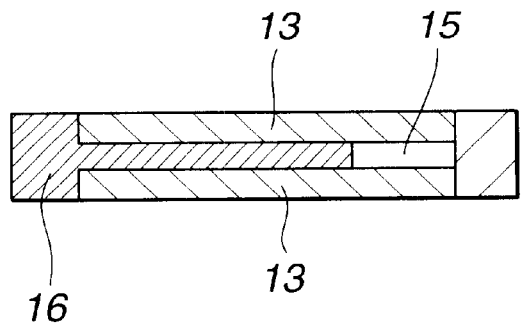

As shown in FIGS. 2A and 2B, a lower slide glass plate 12 was rested on a hot plate 11. A pair of 80-micron polyimide films 13 and 13 laterally spaced 1 cm from each other were set on the glass plate 12. An upper slide glass plate 14 was rested thereon. The slide glass plates 12, 14 defined with the two polyimide films 13, 13 an elongated space 15 having a width of 1 cm and a height of 80 $\mu$m. A mass of epoxy resin composition 16 was placed on the lower slide glass plate 12 at one end of the space 15. With this setting, the hot plate 11 was heated at 80° C. or 120° C. whereupon the epoxy resin composition 16 infiltrated through the space 15. The infiltration time was measured until the composition 16 infiltrated and reached a distance of 20 mm from the one end of the space 15.

Void Detection by Ultrasonic Flaw Detector

A silicon chip of 10 mm×10 mm having 400 bumps was rested on a BT substrate. The assembly was held for 2 hours in an atmosphere of 23° C. and RH 60%. Using a dispenser, an epoxy resin composition was applied to one side of the assembly to seal the underfill area therewith. After the underfill was heat cured, internal voids were detected by means of an ultrasonic flaw detector. A percent void is calculated as the total area of voids divided by the sealing area of the cured underfill.

PCT Separation Test

A polyimide-coated silicon chip of 10 mm×10 mm was rested on a FR-4 substrate of 30 mm×30 mm with a spacer of about 100 $\mu$m thick interposed therebetween. An epoxy resin composition for the underfill was forced to penetrate into the gap between the chip and the substrate and cured therein. The assembly was placed for 168 hours in a pressure cooker test (PCT) environment of 121° C. and 2.1 atm. Thereafter, whether the underfill separated from the chip and the substrate was observed by C-SAM.

Thermal Shock Test

A polyimide-coated silicon chip cut to 10 mm×10 mm and having a thickness of 0.6 mm was rested on a FR-4 substrate of 30 mm×30 mm with a spacer of about 100 $\mu$m thick interposed therebetween. An epoxy resin composition for the underfill was forced to penetrate into the gap between the chip and the substrate. Another epoxy resin composition for the fillet was applied to the sides of the chip. This assembly was heated at 150° C. for 4 hours for curing the epoxy resin compositions. The assembly was subjected to thermal cycling between −55° C. for 1 min and 160° C. for 30 sec. The assembly was observed after 100 cycles. Those samples whose cured portions cracked or separated were rejected. A percent rejection was calculated as a percentage of rejected samples per 20 samples.

The underfill materials used herein are the compositions shown in Tables 1 and 2 while the fillet material used herein is shown below.

| Epoxy resin composition as fillet | |
|---|---|
| Ingredients | Parts by weight |
| RE303S-L | 50 |
| MH700 | 40 |
| HX3741 | 1.5 |
| SE-15 | 350 |
| Copolymer | 10 |
| KBM403 | 2 |

Storage Stability Test

A polyethylene bottle containing a composition sample was sealed and kept for 96 hours in a thermostat chamber at 25° C. A change of viscosity before and after aging was examined.

TABLE 1

| Composition (pbw) | Example 1 | Example 2 | Example 3 | Example 4 | Example 5 |
|---|---|---|---|---|---|
| RE303S-L | 98 | 98 | 95 | 87 | 95 |
| MH700 | | | | | |
| Amino-containing, polyether-modified polysiloxane (1) | 2 | | 5 | 3 | 5 |
| Amino-containing, polyether-modified polysiloxane (2) | | 2 | | | |
| Epoxy-containing, polyether-modified polysiloxane (3) | | | | | |
| Copolymer | | | | 10 | |
| S032H | 150 | 150 | 150 | 150 | 150 |
| 2P4MHZ-PW | 3 | 5 | 3 | 3 | |
| 2MZ-A-PW | | | | | 3 |
| 2E4MZ | | | | | |
| HX3741 | | | | | |
| Viscosity (poise/25° C.) | 450 | 620 | 780 | 820 | 800 |
| Thixotropy | 1.04 | 1.05 | 1.05 | 1.01 | 1.02 |
| Gelling time (sec/150° C.) | 90 | 71 | 95 | 88 | 80 |
| Tg (° C.) | 142 | 135 | 140 | 138 | 135 |
| CTE-1 (ppm/° C.) | 31 | 32 | 31 | 32 | 32 |
| CTE-2 (ppm/° C.) | 98 | 101 | 103 | 104 | 100 |
| Infiltration time (sec/80° C.) | 280 | 270 | 290 | 280 | 280 |
| Infiltration time (sec/120° C.) | 85 | 85 | 80 | 90 | 80 |
| PCT separation test | no separation | no separation | no separation | no separation | no separation |
| Reject (%) in thermal shock test | 0 | 0 | 10 | 0 | 0 |
| Storage stability test | 3% thickened | 3% thickened | 3% thickened | 3% thickened | 3% thickened |
| Voids (%) | 0.05 | 0.08 | 0.05 | 0.03 | 0.05 |

TABLE 2

| Composition (pbw) | Comparative Example 1 | Comparative Example 2 | Comparative Example 3 | Comparative Example 4 | Comparative Example 5 |
|---|---|---|---|---|---|
| RE303S-L | 100 | 50 | 98 | 50 | 100 |
| MH700 | | 40 | | 40 | |
| Amino-containing, polyether-modified polysiloxane (1) | | | | 2 | |
| Amino-containing, polyether-modified polysiloxane (2) | | | | | |
| Epoxy-containing polyether-modified polysiloxane (3) | | | 2 | | |
| Copolymer | | | | | |
| SO32H | 150 | 150 | 150 | 150 | 150 |
| 2P4MHZ-PW | | | 3 | | 3 |
| 2E4MZ | 3 | | | | |
| HX3741 | | 3 | | 3 | |
| Viscosity (poise/25° C.) | 400 | 150 | 550 | 180 | 410 |
| Thixotropy | 1.05 | 1.04 | 1.05 | 1.05 | 1.10 |
| Gelling time (sec/150° C.) | 45 | 65 | 85 | 60 | 95 |
| Tg (° C.) | 138 | 148 | 142 | 148 | 137 |
| CTE-1 (ppm/° C.) | 33 | 28 | 30 | 30 | 31 |
| CTE-2 (ppm/° C.) | 98 | 105 | 102 | 106 | 110 |
| Infiltration time (sec/80° C.) | 340 | 90 | 320 | 95 | 280 |
| Infiltration time (sec/120° C.) | short of 20 mm | short of 20 mm | 80 | short of 20 mm | 90 |
| PCT separation test | no separation | separated | no separation | separated | separated |
| Reject (%) in thermal shock test | 15 | 20 | 10 | 30 | 0 |

TABLE 2-continued

| Composition (pbw) | Comparative Example 1 | Comparative Example 2 | Comparative Example 3 | Comparative Example 4 | Comparative Example 5 |
|---|---|---|---|---|---|
| Storage stability test | 40% thickened | 60% thickened | 3% thickened | 60% thickened | 3% thickened |
| Voids (%) | 10 | 5 | 12 | 4 | 15 |

Note:
RE303S-L: bisphenol F type epoxy resin by Nippon Kayaku K.K.
MH700: methyltetrahydrophthalic anhydride by Shin-Nippon Rika K.K.
KBM403: γ-glycidoxypropyltrimethoxysilane by Shin-Etsu Chemical Co., Ltd.
2P4MHZ-PW: 2-phenyl-4-methyl-5-hydroxymethylimidazole powder having a mean particle diameter of 3.8 μm and a maximum particle diameter of 15 μm by Shikoku Chemicals K.K.
2MZ-A-PW: 2,4-diamino-6-[2'-methylimidazolyl-(1)']-ethyl-S-triazine having a mean particle diameter of 3.5 μm and a maximum particle diameter of 15 μm by Shikoku Chemical K.K.
2E4MZ: 2-ethyl-4-methylimidazole (liquid at room temperature) by Shikoku Chemicals K.K.
HX3741: microcapsulated catalyst containing an imidazole compound by Asahi-Ciba K.K.
SO32H: spherical silica having a maximum particle diameter of 45 μm and a mean particle diameter of 2 μm by Adomatex K.K.
SE-15: spherical fused silica having a mean particle size of 15 μm by Tokuyama Soda K.K.
Amino-containing, polyether-modified polysiloxane (1)

Epoxy-containing, polyether-modified polysiloxane (3)

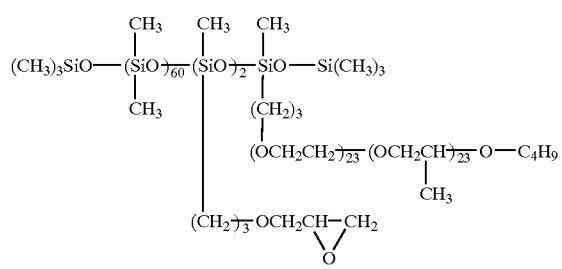

Copolymer: the addition reaction product of the following compounds (dimethylpolysiloxane units in the copolymer: about 81% by weight).

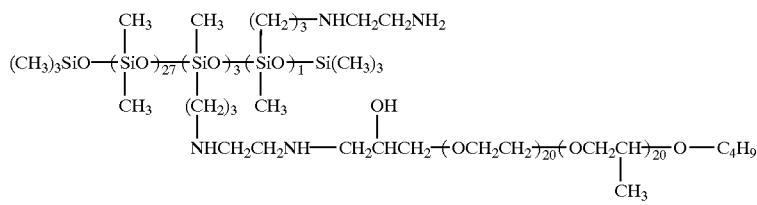

Amino-containing, polyether-modified polysiloxane (2)

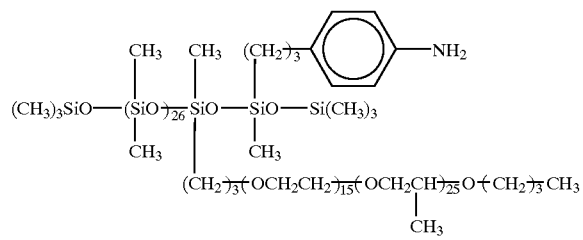

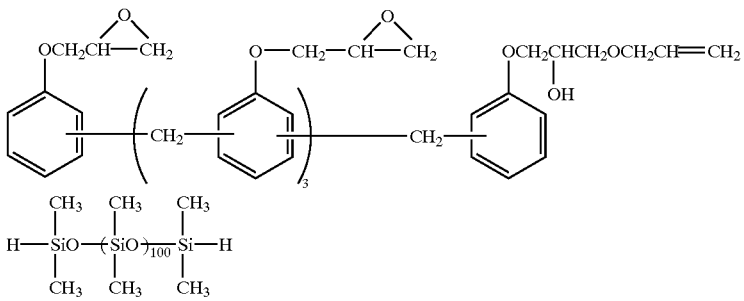

There has been described a flip-chip type semiconductor device sealing material having an improved thin-film infiltration capability and storage stability. The flip-chip type semiconductor device sealed therewith remains highly reliable even when the flux has not been removed.

Japanese Patent Application No. 11-163513 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A sealing material for flip-chip type semiconductor devices in the form of a liquid epoxy resin composition comprising (A) a liquid epoxy resin, (B) an inorganic filler, (C) a curing accelerator having a solubility of up to 1% by weight in the epoxy resin, a melting point of at least 170° C., a mean particle diameter of up to 5 μm, and a maximum particle diameter of up to 20 μm, and represented by the following general formula (1):

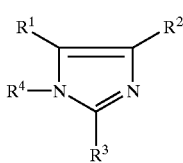

wherein $R^1$ and $R^2$ each are hydrogen, methyl, ethyl, hydroxymethyl or phenyl, $R^3$ is methyl, ethyl, phenyl or allyl, and $R^4$ is hydrogen or a group of the following formula (2):

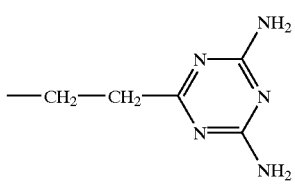

and (D) an amino group-containing, polyether-modified polysiloxane of the following general formula (3):

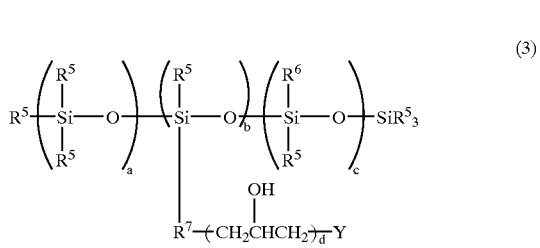

wherein $R^5$ is a monovalent hydrocarbon group of 1 to 6 carbon atoms, $R^6$ is a monovalent hydrocarbon group of 1 to 6 carbon atoms or monovalent organic nitrogenous group having at least one NH group, $R^7$ is a divalent hydrocarbon group of 1 to 10 carbon atoms or divalent organic nitrogenous group having at least one NH group, the compound of formula (3) containing at least one NH group in a molecule, (a) is an integer of 10 to 200, (b) is an integer of 1 to 10, (c) is an integer of 0 to 10, and (d) is equal to 0 or 1, and Y is a group of the following general formula (4):

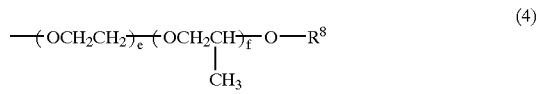

wherein $R^8$ is a monovalent hydrocarbon group of 1 to 6 carbon atoms, (e) is an integer of 0 to 25, (f) is an integer of 5 to 50, and (e) and (f) satisfy $e/f \leq 1$ and $e+f=10$ to 50.

2. The sealing material of claim 1 wherein said curing accelerator (C) is 2-phenyl-4,5-dihydroxymethylimidazole or 2-phenyl-4-methyl-5-hydroxymethylimidazole.

3. The sealing material of claim 1 wherein said curing accelerator (C) is 2,4-diamino-6-[2'-ethyl-4'-methylimidazolyl-(1)']-ethyl-S-triazine or 2,4-diamino-6-[2'-methylimidazolyl-(1)']-ethyl-S-triazine.

4. The sealing material of claim 1 wherein the modified polysiloxane (D) is of the following general formula (5):

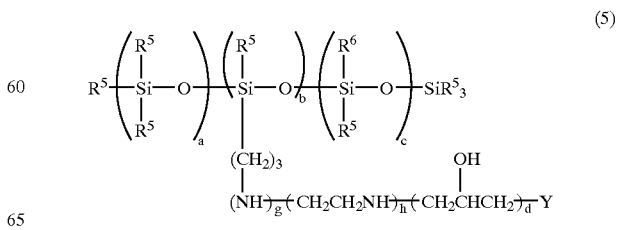

wherein g is equal to 0 or 1, h is 0 or an integer of 1 to 10, and $R^5$, $R^6$, Y, a, b, c and d are as defined above.

5. A flip-chip type semiconductor device sealed with the sealing material of claim 1, 2, 3 or 4 in a cured state.

6. A flip-chip type semiconductor device sealed with the sealing material of claim 1, 2, 3 or 4 in a cured state which device has not been cleaned of a flux used in connecting solder bumps and serving as a binder.

* * * * *